United States Patent
Yuan

(10) Patent No.: US 8,466,486 B2
(45) Date of Patent: Jun. 18, 2013

(54) THERMAL MANAGEMENT SYSTEM FOR MULTIPLE HEAT SOURCE DEVICES

(75) Inventor: Tsorng-Dih Yuan, Hsinchu (TW)

(73) Assignee: TSMC Solid State Lighting Ltd., HsinChu (TW)

( * ) Notice: Subject to any disclaimer, the term of this patent is extended or adjusted under 35 U.S.C. 154(b) by 292 days.

(21) Appl. No.: 12/870,164

(22) Filed: Aug. 27, 2010

(65) Prior Publication Data

US 2012/0049233 A1     Mar. 1, 2012

(51) Int. Cl.
*H01L 33/00*     (2010.01)
(52) U.S. Cl.
USPC ............ 257/99; 257/276; 257/625; 257/675; 257/706; 257/717; 257/720; 257/796
(58) Field of Classification Search
USPC .................. 257/99, 276, 625, 675, 706, 717, 257/720, 796
See application file for complete search history.

(56) References Cited

U.S. PATENT DOCUMENTS

| | | | |
|---|---|---|---|
| 4,114,177 A * | 9/1978 | King | 257/81 |
| 4,829,321 A * | 5/1989 | Iizuka et al. | 347/237 |
| 7,098,486 B2 | 8/2006 | Chen | |
| 7,538,356 B2 | 5/2009 | Lai | |
| 7,609,520 B2 | 10/2009 | Chang et al. | |
| 2002/0197603 A1 * | 12/2002 | Chow et al. | 435/6 |

OTHER PUBLICATIONS

George M. Harpole and James E. Eninger; "Micro-Channel Heat Exchanger Optimization;" 1991; TRW R1/1022, Seventh IEEE SEMI-THERM™ Symposium; IEEE; Redondo Beach, CA 90278, pp. 59-63.
Franz Laerner and Andrea Urban; "Milestones In Deep Reactive ION Etching;" Jun. 5-9, 2005; 3B1.1; Robert Bosch GmbH; IEEE; Stuttgart, German; pp. 1118-1121.

* cited by examiner

*Primary Examiner* — Tan N Tran
(74) *Attorney, Agent, or Firm* — Haynes and Boone, LLP

(57) ABSTRACT

The present disclosure provides systems and methods for forming a semiconductor device. The semiconductor device includes a substrate having a first side and a second side opposite the first side. A first heat producing element is formed on the first side of the substrate. A second heat producing element is formed on the first side of substrate coplanar with, but not touching the first heat producing element. A heat spreader is coupled to the second side of the substrate using a thermal interface material. The heat spreader includes a first and second vapor chambers. The first vapor chamber is embedded in the heat spreader substantially opposite the first heat producing element. The second vapor chamber is embedded in the heat spreader substantially opposite the second heat producing element. As an example, the first heat producing element may be a light-emitting diode (LED) and the second heat producing element may be a driver circuit for the LED.

20 Claims, 8 Drawing Sheets

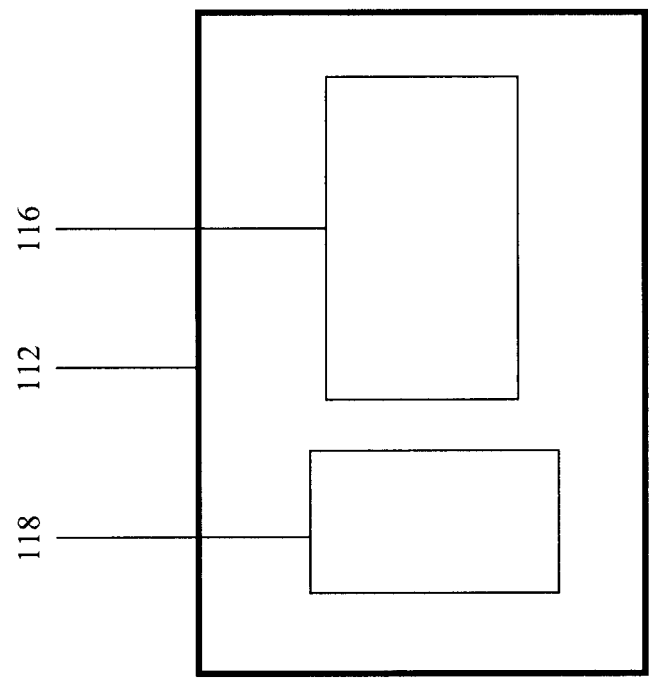
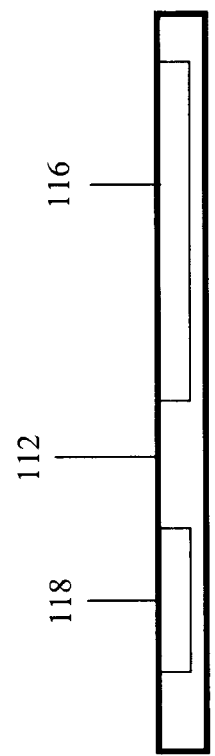

THERMAL MANAGEMENT SYSTEM FOR MULTIPLE HEAT SOURCE DEVICES

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value.

For example, light-emitting diode (LED) circuit devices generally produce a relatively low amount of heat when compared to their counterpart incandescent and/or halogen lights. However, high-output capacity LEDs (e.g., up to 100 watts) generate a enough heat that the heat must be managed to prevent burning-up the LED device with the generated heat. Traditional solutions assume a uniform heat distribution throughout the device and thus provide a traditional thermal interface material (TIM) and a large copper block heat spreader attached between an LED and the surface of a large heat sink device. Other traditional solutions couple an LED device to a vapor chamber. However, this solution again assumes a uniform heat distribution throughout the device and has a large vapor chamber for the entire LED device such that non-heat producing portions of the LED device are also coupled the vapor chamber which is attached to a surface of a heat sink and serve little purpose in removing heat.

Thus, it is desirable to have a thermal management system for multiple heat source devices, such as LEDs, addressing one or more of the issues discussed above, such as a thermal management system that provides thermal management for device hot spots and multiple heat producing components.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 2 illustrates an elevation view of an embodiment of a heat spreader for a heat transfer system according to the present disclosure.

FIG. 3 illustrates a plan view of an embodiment of a heat spreader for a heat transfer system according to the present disclosure.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

The present disclosure provides embodiments of a thermal management system for multiple heat source devices. For example, a high power light-emitting diode (LED) (e.g., up to approximately 50-100 watt) device includes both an LED die and a driver circuit to drive the LED die. These two devices are generally formed on a substrate, separate from one another. Therefore, the heat produced by each of them is separate and individualized. Thus, the present disclosure provides systems and methods to provide customized heat/thermal management for each heat producing element of the device. It should be understood that embodiments of the present disclosure may be utilized for other heat producing devices where multiple heat producing devices, such as resistors, transistors, and any variety of other heat producing devices, are formed into a single device.

Figure 1:
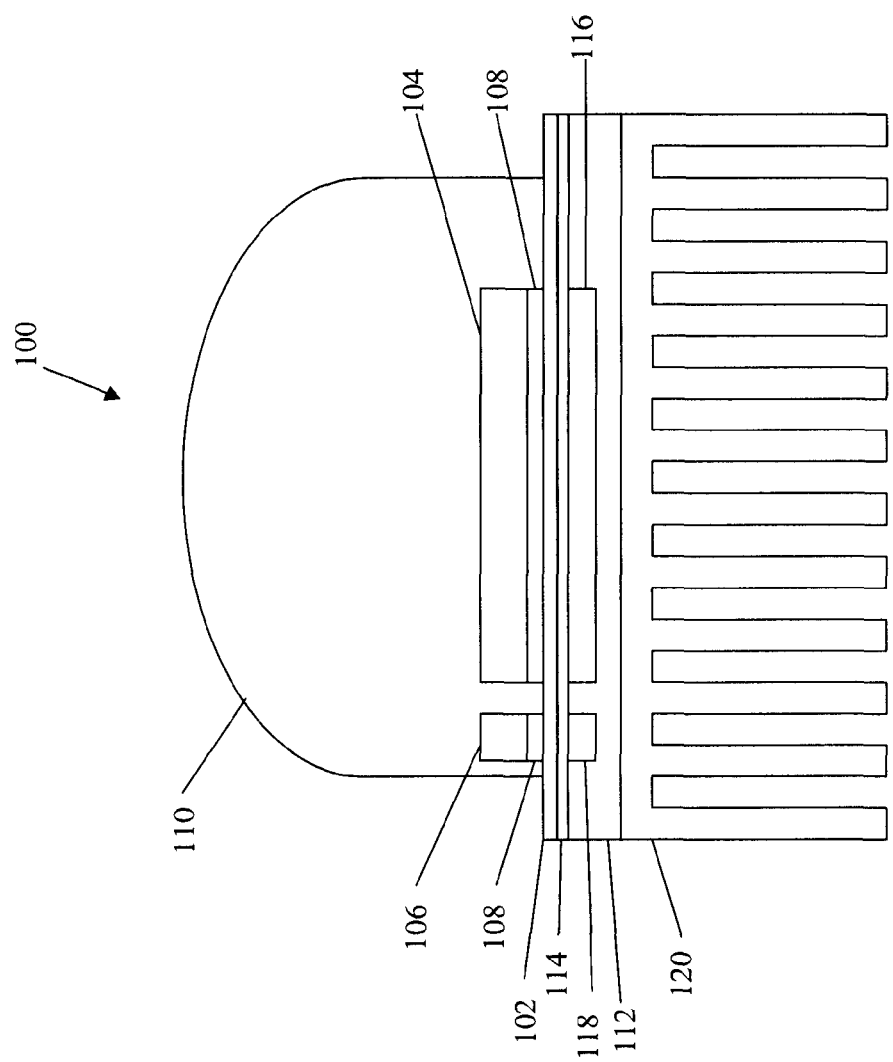
FIG. 1 illustrates an elevation view of an embodiment of a light-emitting diode (LED) device having multiple heat sources and associated thermal management according to the present disclosure.

FIG. 1 illustrates an elevation view of an embodiment of a light-emitting diode (LED) device 100 having multiple heat sources and associated thermal management according to the present disclosure. An embodiment of the LED 100 is formed using method 500 of FIG. 5, described in more detail below. However, it should be understood that other methods may be used for forming the LED 100.

The LED 100 includes a substrate 102. The substrate 102 may include various doping configurations depending on design requirements as may be known in the art. The substrate 102 may also include other elementary semiconductors such as germanium and diamond. Alternatively, the substrate 102 may include a compound semiconductor and/or an alloy semiconductor. In the present embodiment, the substrate 102 includes a silicon material, such as a silicon substrate. In operation, the device 100 may have an active region in the substrate 102.

The LED 100 includes an LED die 104 and an LED driver circuit 106 formed on the substrate 102. In operation, the LED die 104 and the driver circuit 106 each independently produce heat, requiring thermal management to prevent components of the device 100 from over heating and burning up. The LED 100 also includes a dielectric polymer material 108 that adheres the LED die 104 and the driver circuit 106 to the substrate 102. The die 104 is generally formed of a doped semi conducting material forming a p-n junction. The die 104 may be formed to radiate light at any frequency in the spectrum. Formation of LED dies (e.g. die 104) should be understood by those having ordinary skill in the art and is only briefly described herein for simplicity. The die 104 and/or the driver circuit 106 may be formed directly on the substrate 102 or may be formed away from the substrate 102 and coupled to the substrate 102 using an adhesive, such as the dielectric polymer material 108. In addition, the LED 100 may include supporting elements such as an anode, a cathode, a leadframe (anvil and post), a reflective cavity, and conductor leads between the die 104 and the driver circuit 106.

A lens 110 is formed over the die 104 and the driver circuit 106. In an embodiment, the lens 110 comprises silicone. In other embodiments, the lens comprises an epoxy material, a plastic material, and/or other varieties of light transmissive materials. The lens 110 forms a protective seal over the die 104 and the driver circuit 106 and also focuses/distributes light produced by the die 104. Forming such a seal over the die 104 and the driver circuit 106 holds heat near the die 104 and the driver circuit 106, which may destroy the devices 104, 106 if not removed. This problem is magnified in high power (e.g., up to approximately 100 watts) LED devices.

The substrate 102 is physically and thermally coupled to a heat spreader 112 using a layer of a thermal interface material (TIM) there between. In an embodiment, the TIM comprises a silver epoxy thermal interface material, which is formulated for high heat transfer characteristics. Other TIMs may be used with the present disclosure and should be selected to realize the thermal spreading purpose and capacities of the TIM and of the device 100.

The heat generated by the die 104 and the driver circuit 106 is easily conducted through the dielectric 108, the substrate 102 and the TIM 114 to the heat spreader 112 and away from the heat producing elements (e.g., the die 104 and the driver circuit 106). The heat spreader 112 is formed of a heat conducting material, such as copper, aluminum, and etc., and includes a vapor chamber 116 to receive heat generated by the die 104 and a vapor chamber 118 to receive heat generated by the driver circuit 106. The heat spreader 112 receives the heat via the vapor chambers 116 and 118 and because of it's heat conducting properties, disperses the heat throughout the heat spreader 112 to a heat sink 120. The heat sink 120 is a fin-type heat sink comprising a heat conducting material, such as anodized aluminum. However, other types of heat sinks may be used with the present disclosure. For example, in an embodiment, the heat spreader 112 may be incorporated as the base of the heat sink 120.

FIGS. 2 and 3 respectively illustrate an elevation view and a plan view of an embodiment of the heat spreader 112 for a heat transfer system according to the present disclosure. The body of the heat spreader 112 is formed as a copper block having depressions formed in the block to receive vapor chambers 116 and 118 therein. As such, the heat spreader 112 is developed such that the heat generating locations for the device 100 (e.g., proximate the die 104 and the driver circuit 106) have corresponding vapor chambers (e.g., 116 and 118) embedded into the heat spreader 112. The vapor chambers 116 and 118 may be thermally coupled to the heat spreader 112 using a TIM. Thus, the heat spreader 112 very efficiently draws the heat from the vapor chambers and away from the heat producing elements. In other words, the heat spreader 112 is customized for each application to have vapor chambers (e.g., 116 and 118) proximate the heat producing elements. The heat spreader 112 also has a larger solid mass in areas other than proximate the heat producing elements to spread out the heat. It should be understood that other materials may be used to form the heat spreader 112 such that the material receives heat and can effectively spread the heat along the body of the heat spreader 112 using conductive heat transfer. The heat spread along the body of the heat spreader 112 is dissipated by the heat sink 120 to ambient air. A TIM (e.g., like TIM 114) may also be used between the heat spreader 112 and the heat sink 120.

Figure 4:
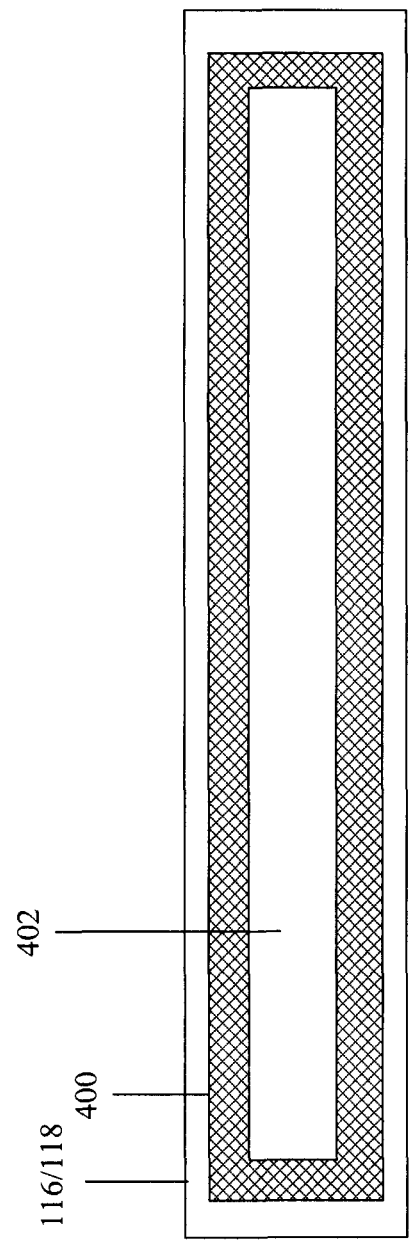
FIG. 4 illustrates a view of an embodiment of a vapor chamber according to the present disclosure.

FIG. 4 illustrates a view of an embodiment of a vapor chamber 116/118 according to the present disclosure. The vapor chamber 116/118 is a hermetically sealed vacuum chamber. The vapor chamber 116/118 is formed from a heat conductive material, such as copper or aluminum, and includes a wick material 400 formed inside around the outer perimeter of the vapor chamber 116/118. An inner portion of the vapor chamber 116/118 includes an open space filled with a working fluid 402. The outer surface of the vapor chamber 116/118, being heat conductive, receives heat from the surface of the vapor chamber 116/118.

Inside the vapor chamber 116/118, the working fluid 402 receives the heat from the body of the vapor chamber. The wick 400 provides small pockets of the working fluid 402 near the surface of the vapor chamber 116/118. Because the working fluid 402 is in small pockets near the outer body of the vapor chamber 116/118, it quickly reaches a boiling point and changes phases by evaporating. The wick 400 then allows the working fluid, as a vapor, to disperse throughout the wick 400 and thus, efficiently transfer the heat around the outer perimeter of the vapor chamber 116/118. This, in turn, transfers the heat to the body of the heat spreader 112. As the heat is absorbed by the heat spreader 112, the working fluid 402 cools and condenses back into a fluid and is again ready to absorb heat. In other words, the phase change of the working fluid 402 absorbs latent heat to form a vapor. The vapor releases latent heat and returns to a liquid. This process repeats itself to continue transferring heat. The heating side and the cooling side of the vapor chamber 116/118 create a pressure drop across the device with the evaporating fluid. This in turn, speeds up vapor flow to deliver and spread the heat to the heat spreader 112.

In an embodiment, the wick 400 is a multi-layer copper bonded mesh. Various sizes of the mesh are compounded together to provide multiple sizes of pockets for the working fluid 402. The mesh may have hollow centers and may be formed as nano tubes allowing the working fluid 402 to travel inside of the tubes. It is contemplated that other wick configurations will also work with the present disclosure. In an embodiment, the working fluid 402 is pure degassed water. However, it is also contemplated that refrigerants or other fluids may be used with the present disclosure.

Figure 5:
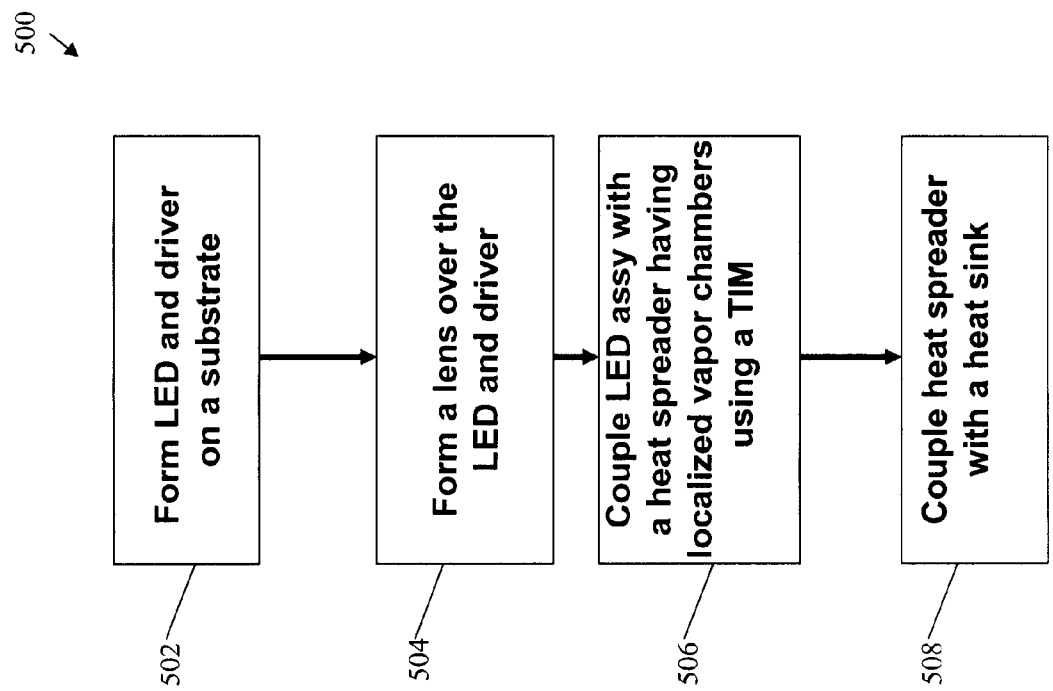
FIG. 5 illustrates a flow chart of an embodiment of a method of providing a heat management system for multiple heat sources in a device according to the present disclosure.

FIG. 5 illustrates a flow chart of an embodiment of a method 500 for providing a heat management system for multiple heat sources in a device according to the present disclosure. The process steps of the method 500 relate to the embodiments of the LED device 100 provided above with reference to FIGS. 1-4. The method 500 begins at block 502 where an LED device (e.g., 104) and a driver circuit (e.g., 106) are formed on a substrate (e.g., 102). The method 500 proceeds to block 504 where a lens (e.g., 110) is formed over the LED and the driver circuit. The method 500 then proceeds to block 506 where the LED assembly is coupled to a heat spreader (e.g., 112) using a thermal interface material (TIM), wherein the heat spreader (e.g., 112) includes multiple localized vapor chambers (e.g., 116/118) embedded in the heat spreader (e.g., 112) at locations according to the heat generation profile of the device. The method then ends at block 508 where the heat spreader (e.g., 112) is thermally coupled to a heat sink (e.g., 120). Some steps in this method 500 may be omitted and other steps not presented here may be added in order to form a multiple heat source device, such as a circuit device, and an associated heat management system.

In essence, an embodiment of the method 500 provides a customized thermal management system design considering device hot spot locations using an effective thermal interface material and a heat spreader having multiple embedded vapor chambers at the device hot spot locations. Using the principals of the method 500 one would readily be able to utilize similar thermal management for other devices having multiple heat generating elements using a heat/power map for the device showing the heat generating locations of the device and customizing a heat spreader with embedded vapor chambers at the heat generating locations and sized according to the generated heat at the specific location. As such, a thermal performance improvement of approximately 40%-60% may be achieved for the device.

Figure 6:
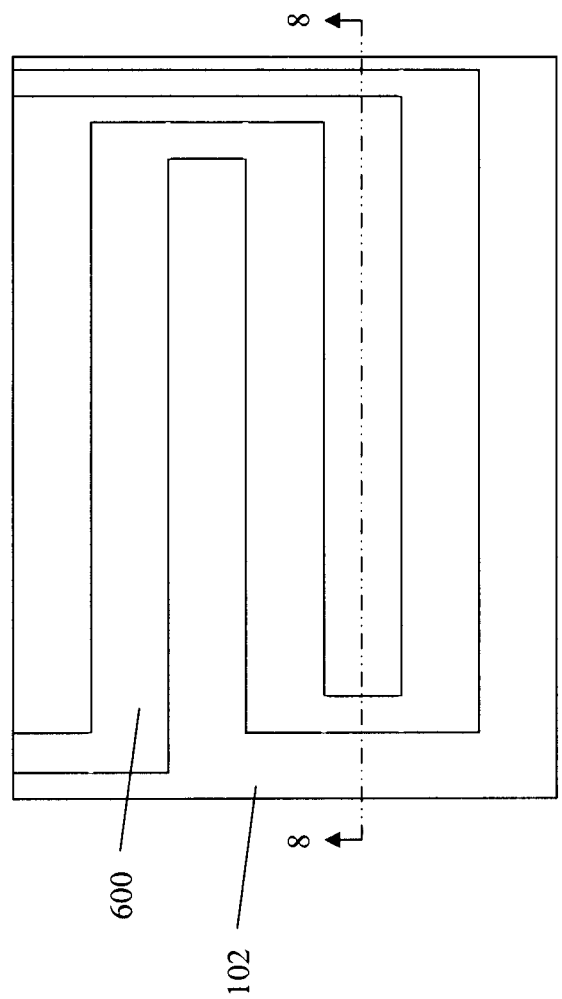
FIGS. 6-7 illustrate a plan view of an embodiment of a substrate having cooling micro channels for a heat transfer system according to the present disclosure at different stages of manufacture.
Figure 7:
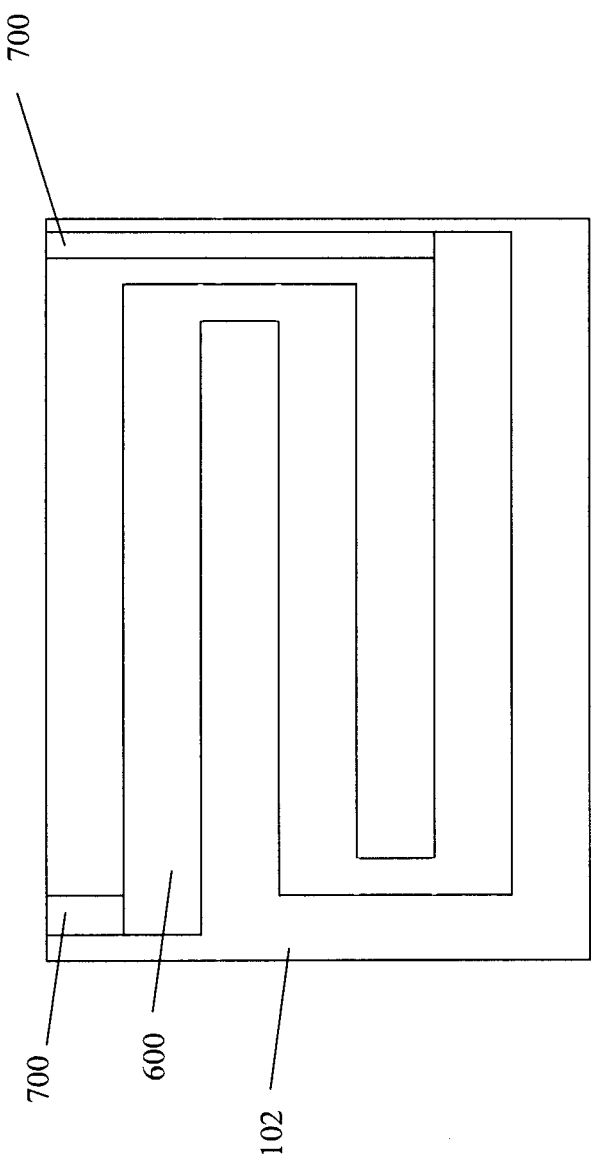

Liquid cooling of devices may be around 25 times better in terms of cooling efficiency than static air cooling. FIGS. 6-7 illustrate a plan view of an embodiment of a substrate having cooling micro channels for a liquid heat transfer system according to the present disclosure at different stages of manufacture. FIG. 6 shows a substrate, such as the substrate 102, having a micro channel 600 formed within the substrate 102. The micro channel 600 is formed as a small, internal channel in the substrate 102 that holds a cooling fluid that absorbs heat produced by the heat producing elements, such as the die 104 and the driver circuit 106. The micro channel 600 is filled with a cooling fluid, such as, purified water, a dielectric fluid, air, gas, and/or other cooling fluids. For devices with a higher heat capacity, fluids having a higher thermal conductivity may be used. The micro channel 600 may be filled with the cooling fluid and sealed using a sealant 700. In an embodiment, the sealant 700 is a compressible elastomer filling the inlet and outlet tubes of the micro chamber 600. However, other sealants may be used to seal the cooling fluid in the micro chamber 600. The cooling fluid then disperses the absorbed heat throughout the substrate 102. The micro channel 600 may be formed in any pattern in the substrate 102, such as proximate the heat producing elements (e.g., the die 104 and the driver circuit 106). In another embodiment, the micro channel 600 is formed throughout the body of the substrate 102. When the micro channel 106 substrate is used in conjunction with the localized vapor chamber cooling system described above, the heat producing elements benefit from the combined improved cooling. Thus, LED devices may benefit from a lower junction temperature.

The micro channel 600 may be formed in the substrate 102 using CMOS processes. FIGS. 8 and 9A-9D show different fabrication processes for forming the micro channel 600. In an embodiment, the micro channel 600 is formed to have a channel fin height and width range of approximately 10 um to approximately 200 um and a channel length range of approximately 200 um to approximately 900 um. However, other sizes of channel 600 may be used and adjusted to optimize cooling for the specific application. A pressure of the cooling fluid in the micro channel 600 may range from approximately 0.2 bar to approximately 2 bar (or 0.29 psi to 29 psi), depending on coolant pump used in filling the micro channel 600 with the cooling fluid. Thus, the pressure range of the coolant may vary for other devices using a cooling channel. In an embodiment, a pressure decrease may be accomplished by subdividing the coolant fluid flow into multiple heat exchanger zones with shorter channel lengths.

Figure 8:
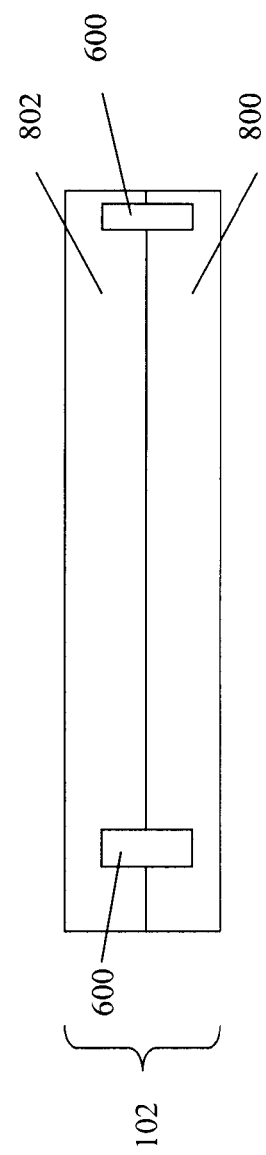
FIG. 8 illustrates an elevation section view of an embodiment of a substrate having cooling micro channels for a heat transfer system according to the present disclosure at a stage of manufacture.

FIG. 8 illustrates an elevation section view along line 8-8 of FIG. 6 of an embodiment of a substrate 102 having cooling micro channels 600 for a heat transfer system according to the present disclosure at a stage of manufacture. In this embodiment, the micro channel 600 is formed by forming channels in two wafers (e.g., wafers 800 and 802) and then bonding the wafers 800 and 802 together to form the micro channel 600 within the substrate 102. The channels in the wafers 800 and 802 may be formed using a deep reactive ion etching (DRIE) etching process to etch the wafers 800 and 802.

Figure 9:
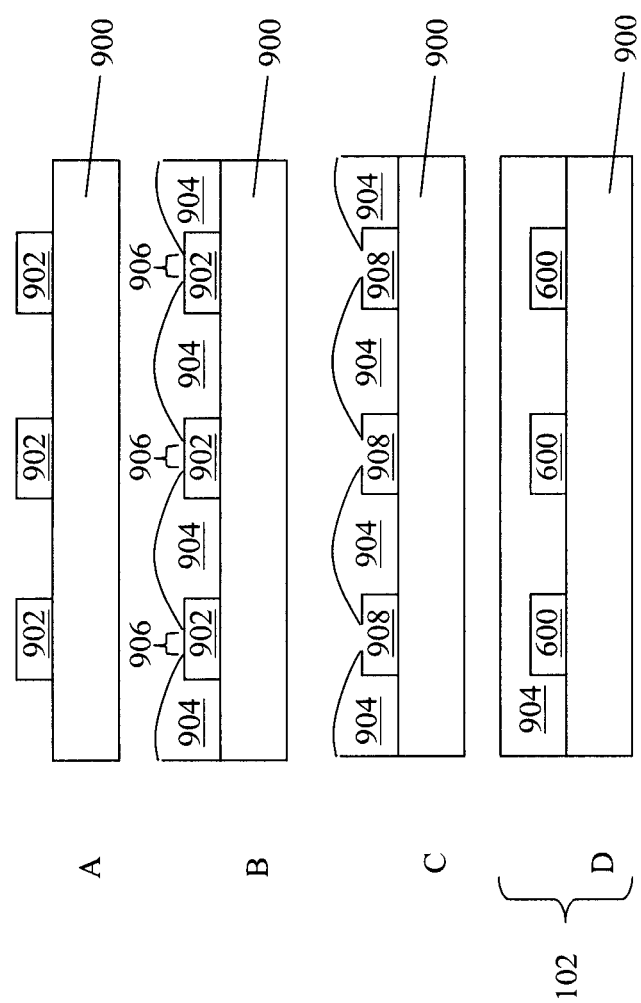
FIG. 9 illustrates an elevation section view of another embodiment of a substrate having cooling micro channels for a heat transfer system according to the present disclosure at a various stages of manufacture.

FIG. 9 illustrates an elevation section view of another embodiment of the substrate 102 having cooling micro channels 600 for a heat transfer system according to the present disclosure at a various stages of manufacture, as shown in stages A, B, C, and D. As shown in A, a substrate wafer 900 is provided and a thick photoresist layer 902 is patterned on the wafer 900 in the form of the desired micro channel. In B, a metal layer 904 is formed (e.g., electroplated) over the wafer 900 and the photoresist layer 902 until the photoresist layer 902 is almost covered, leaving a small gap 906 exposing the photoresist layer 902. At C, the photoresist layer 902 is etched or otherwise removed from the wafer, leaving channels 908. Then, at D, the electroplating is resumed to cover the channels 908 with the metal layer 904, thereby forming the substrate 102 having enclosed micro channels 600. Some of these stages may be omitted and other stages not discussed here may be added to forming the substrate 200. Materials used in forming the substrate 102 and the micro channels 600 may be varied as desired.

As described herein, the micro channel 600 substrate (e.g., 102) may be filled with de-ionized or otherwise purified water as a coolant. The substrate 102 may be customized to provide a localized cooling path to reduce cooling cycle time and the chip design layout may be developed using design-in integration. As should be understood, the micro channel 600 can be formed using CMOS fabrication processes. Use of a micro channel 600 can additionally provide a unique cooling design for heat producing elements, such as LEDs, and gives a lower junction temperature for the device. As a result, the device may be made smaller and have a reduced thermal resistance, which is aided by improved heat/power dissipation from improved external cooling. Referring back to the method 500 of FIG. 5, fabricating a device with a micro channel using the method 500 should be readily understood by those having skill in the art. In an embodiment, a micro channel device may be formed by checking the device (LED device) design parameters, checking power levels and heat locations of the device to determine a need for liquid micro channel cooling, forming a pre-fabricated micro channel cooling path designed for the heat spots in the device, sealing a cooling fluid in the micro channel, and assembling the LED device.

It should be readily apparent to those having ordinary skill in the art that the systems and methods disclosed herein provide thermal handling of devices having an increased power density with an emphasis on hot spot temperature control. Accordingly, the systems and methods provided herein achieve a better temperature gradient and a lower thermal junction temperature for the LED device 100 using the advanced thermal design having better spreading of generated heat and a more efficient thermal management. This, in turn, provides better electrical performance for the heating element devices. The localized vapor chambers provided are reduced in size and thus reduced in space, thereby creating a manufacturing cost savings. The heat spreader and vapor chamber designs and TIM selection may be optimized throughout thermal modeling and prototype verification of the heat generating elements so that the device design will meet cost and performance goals.

In an embodiment, the present disclosure provides systems and methods for forming a semiconductor device. The semiconductor device includes a substrate having a first side and a second side opposite the first side. A first heat producing element is formed on the first side of the substrate. A second heat producing element is formed on the first side of substrate co-planar with, but not touching the first heat producing element. A heat spreader is coupled to the second side of the substrate using a thermal interface material. The heat spreader includes a first and second vapor chambers. The first vapor chamber is embedded in the heat spreader substantially opposite the first heat producing element. The second vapor chamber is embedded in the heat spreader substantially opposite the second heat producing element. As an example, the first heat producing element may be a light-emitting diode (LED) and the second heat producing element may be a driver circuit for the LED.

In an embodiment, the present disclosure provides a semiconductor device, wherein the device includes a substrate having a first side and a second side opposite the first side. A first heat producing element is formed on the first side of the substrate. A second heat producing element is formed on the first side of substrate co-planar with, but not touching the first heat producing element. A heat spreader is coupled to the second side of the substrate using a thermal interface material. The heat spreader includes a first vapor chamber embedded in the heat spreader substantially opposite the first heat producing element and a second vapor chamber embedded in the heat spreader substantially opposite the second heat producing element.

In another embodiment, the present disclosure provides a light-emitting diode (LED) assembly. The assembly includes a substrate having a first side and a second side opposite the first side, the substrate includes a fluid-filled micro channel formed within the substrate. An LED element is formed on the first side of the substrate and a driver circuit is formed on the first side of substrate co-planar with, but not touching the LED element. A heat spreader is coupled to the second side of the substrate using a thermal interface material. The heat spreader includes a first vapor chamber embedded in the heat spreader substantially opposite the LED element and a second vapor chamber embedded in the heat spreader substantially opposite the driver circuit.

In yet another embodiment, the present disclosure provides a method of forming a light-emitting diode (LED) assembly. The method includes providing a substrate having a first side and a second side opposite the first side, forming an LED element on the first side of the substrate and forming a driver circuit on the first side of substrate co-planar with, but not touching the LED element. The method also includes coupling a heat spreader to the second side of the substrate using a thermal interface material. The heat spreader includes a first vapor chamber embedded in the heat spreader substantially opposite the LED element and a second vapor chamber embedded in the heat spreader substantially opposite the driver circuit.

In summary, the methods and devices disclosed herein provide a heat management system for multiple heat source devices. In doing so, the present disclosure offers several advantages over prior art devices. It is understood that different embodiments disclosed herein offer different disclosure, and that they may make various changes, substitutions and alterations herein without departing from the spirit and scope of the present disclosure.

What is claimed is:

1. A semiconductor device comprising:
a substrate having a first side and a second side opposite the first side;
a first heat producing element formed on the first side of the substrate;
a second heat producing element formed on the first side of substrate co-planar with, but not touching the first heat producing element; and
a heat spreader coupled to the second side of the substrate using a thermal interface material, the heat spreader including,
a first vapor chamber embedded in the heat spreader substantially opposite the first heat producing element, and
a second vapor chamber embedded in the heat spreader substantially opposite the second heat producing element;
wherein at least one of the first vapor chamber and the second vapor chamber is enclosed by the heat spreader.

2. The device of claim 1, wherein the first heat producing element is a light-emitting diode (LED) and the second heat producing element is a driver circuit for the LED.

3. The device of claim 1, wherein the thermal interface material is a silver epoxy material.

4. The device of claim 1, further comprising a fin-type heat sink thermally coupled to the heat spreader opposite the substrate.

5. The device of claim 1, wherein the vapor chambers each include a hermetically sealed chamber having a mesh wick and a working fluid inside.

6. The device of claim 5, wherein the mesh wick is a layered copper mesh formed around an outer perimeter inside the hermetically sealed chamber.

7. The device of claim 1, wherein the substrate includes a fluid-filled micro channel within the substrate, the micro channel is formed in the substrate proximate the first and second heat producing elements.

8. A light-emitting diode (LED) assembly comprising:
a substrate having a first side and a second side opposite the first side, the substrate including a fluid-filled micro channel formed within the substrate;
an LED element formed on the first side of the substrate;
a driver circuit formed on the first side of substrate co-planar with, but not touching the LED element; and
a heat spreader coupled to the second side of the substrate using a thermal interface material, the heat spreader including,
a first vapor chamber embedded in the heat spreader substantially opposite the LED element, and
a second vapor chamber embedded in the heat spreader substantially opposite the driver circuit;
wherein at least one of the first vapor chamber and the second vapor chamber contains a fluid therein.

9. The LED assembly of claim 8 further comprising a silicone lens enclosing the LED element and the driver circuit.

10. The LED assembly of claim 8, wherein the thermal interface material is a silver epoxy material.

11. The LED assembly of claim 8, further comprising a fin-type heat sink thermally coupled to the heat spreader opposite the substrate.

12. The LED assembly of claim 8, wherein the vapor chambers each include a hermetically sealed chamber having a mesh wick.

13. The LED assembly of claim 12, wherein the fluid is purified water.

14. The LED assembly of claim 8, wherein the micro channel includes a fluid chamber formed proximate the LED element and the driver circuit.

15. A method of forming a light-emitting diode (LED) assembly, the method comprising:
- providing a substrate having a first side and a second side opposite the first side;
- forming an LED element on the first side of the substrate;
- forming a driver circuit on the first side of substrate co-planar with, but not touching the LED element; and
- coupling a heat spreader to the second side of the substrate using a thermal interface material, wherein the heat spreader includes a first vapor chamber embedded in the heat spreader substantially opposite the LED element and a second vapor chamber embedded in the heat spreader substantially opposite the driver circuit, wherein at least one of the first vapor chamber and the second vapor chamber contains a fluid therein.

16. The method of claim 15, further comprising enclosing the LED element and the driver circuit using a silicone lens.

17. The method of claim 15, further comprising forming a micro channel in the substrate proximate the LED element and the driver circuit, and sealing the micro channel with a heat transferring fluid therein.

18. The method of claim 15, further comprising thermally coupling a fin-type heat sink to the heat spreader opposite the substrate.

19. The method of claim 15, further comprising forming the vapor chambers to each include a hermetically sealed chamber having a mesh wick.

20. The method of claim 19, further comprising supplying the working fluid as a pure water and forming the mesh wick as a layered copper mesh around an outer perimeter before hermetically sealing the chamber.

* * * * *